United States Patent
Ulavi et al.

(10) Patent No.: US 11,769,684 B2
(45) Date of Patent: Sep. 26, 2023

(54) WAFER HEATER WITH BACKSIDE AND INTEGRATED BEVEL PURGE

(71) Applicant: Applied Materials, Inc., Santa Clara, CA (US)

(72) Inventors: Tejas Ulavi, San Jose, CA (US); Vijay D. Parkhe, San Jose, CA (US); Naveen Kumar Nagaraja, Karnataka (IN); Sanjeev Baluja, Campbell, CA (US); Surajit Kumar, San Jose, CA (US); Dhritiman Subha Kashyap, Bangalore (IN); Ashutosh Agarwal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/080,421

(22) Filed: Dec. 13, 2022

(65) Prior Publication Data
US 2023/0113057 A1    Apr. 13, 2023

Related U.S. Application Data

(63) Continuation of application No. 17/066,974, filed on Oct. 9, 2020, now abandoned.
(Continued)

(51) Int. Cl.
*H01T 23/00*    (2006.01)
*H01L 21/683*    (2006.01)
(Continued)

(52) U.S. Cl.
CPC ...... *H01L 21/6833* (2013.01); *C23C 16/4585* (2013.01); *C23C 16/4586* (2013.01);
(Continued)

(58) Field of Classification Search
None
See application file for complete search history.

(56) References Cited

U.S. PATENT DOCUMENTS 5,688,331 A * 11/1997 Aruga .................... C23C 16/46
                                                    118/728
6,544,340 B2    4/2003 Yudovsky
(Continued)

FOREIGN PATENT DOCUMENTS

JP    2003178937 A    6/2003
JP    2009256789 A    11/2009
(Continued)

OTHER PUBLICATIONS

PCT International Search Report and Written Opinion in PCT/US2020/054995 dated Jan. 28, 2021, 14 pages.
Machine Translation of JP2016189425, 37 pages.

*Primary Examiner* — Stephen W Jackson
(74) *Attorney, Agent, or Firm* — Servilla Whitney LLC (57) ABSTRACT

Substrate supports comprising a plurality of bonded plates forming a single component support body and methods of forming the substrate supports are described. The single component support body has an outer peripheral edge, a top surface and a bottom surface. A pocket is formed in the top surface and has a bottom surface, a depth and an outer peripheral edge. A purge ring is spaced a distance from the outer peripheral edge and comprises at least one opening in the top surface in fluid communication with a purge gas line within the body thickness.

18 Claims, 5 Drawing Sheets

Related U.S. Application Data

(60) Provisional application No. 62/914,474, filed on Oct. 12, 2019.

(51) Int. Cl.
    *H01L 21/67*     (2006.01)
    *C23C 16/458*     (2006.01)
    *C23C 16/455*     (2006.01)

(52) U.S. Cl.
    CPC .. *H01L 21/67103* (2013.01); *H01L 21/67248* (2013.01); *C23C 16/45544* (2013.01)

(56) References Cited

U.S. PATENT DOCUMENTS

| | | |
|---|---|---|
| 6,730,175 B2 | 5/2004 | Yudovsky et al. |
| 6,866,746 B2 * | 3/2005 | Lei .................. C23C 16/4412 118/733 |
| 9,490,150 B2 * | 11/2016 | Tzu .................. H01L 21/67109 |
| 2003/0066608 A1 | 4/2003 | Natsuhara et al. |
| 2006/0177697 A1 | 8/2006 | Kachi et al. |
| 2007/0040265 A1 | 2/2007 | Umotoy et al. |
| 2009/0235866 A1 | 9/2009 | Takashi et al. |
| 2013/0037532 A1 | 2/2013 | Volfovski et al. |
| 2016/0329231 A1 | 11/2016 | Parkhe et al. |
| 2018/0096870 A1 | 4/2018 | Yoshida et al. |

FOREIGN PATENT DOCUMENTS

| | | |
|---|---|---|
| JP | 2016189425 A | 11/2016 |
| JP | 2018060834 A | 4/2018 |

\* cited by examiner

WAFER HEATER WITH BACKSIDE AND INTEGRATED BEVEL PURGE

CROSS-REFERENCE TO RELATED APPLICATIONS

This application is a Continuation Application of U.S. application Ser. No. 17/066,974, filed Oct. 9, 2020, which claims priority to U.S. Provisional Application No. 62/914,474, filed Oct. 12, 2019, the entire disclosures of which are hereby incorporated by reference herein.

TECHNICAL FIELD

Embodiments described herein generally relate to apparatus for spatially separated multiple wafer processing tools. In particular, embodiments of the disclosure are directed to wafer pedestal heaters with improved backside purge.

BACKGROUND

In a semiconductor wafer processing chamber, such as an atomic layer deposition (ALD) chamber, wafer backside pressure control and edge purge provide advantages for processing. Wafer backside pressure control can provide improved temperature uniformity of the wafer. Edge purging can prevent deposition on the backside and curved edge of the wafer.

Conventional backside pressure control is accomplished with a seal band on the pedestal surface near the wafer edge. The gas flow path goes through the pedestal to a pocket behind the wafer and into the seal band. Pressure control is done with a component that controls flow rate, measures pressure, and has a flow path to a pump that bypasses the chamber.

Conventional edge purge can be accomplished by a couple different techniques. Gas can be delivered through a line in the pedestal and distributed to the edges underside of the wafer edge through either a recursive channel, a plenum near the circumference of the pedestal, or a combination of both. This technique requires an edge ring design that goes around the wafer to direct the flow of gas. The edge ring can be integrated into the pedestal or a separate component. The edge purge techniques are limited in effectiveness based on how well the flow can be distributed around the edge of the wafer.

For both backside pressure control and edge purging, any features put into a pedestal will impact other design components and goals. For example, putting a gas distribution channel in a pedestal will have a negative impact on the temperature uniformity that can be achieved with that pedestal due to required design compromises. Therefore, there is a need in the art for improved apparatus for backside pressure control and edge purging.

Accordingly, there is a need for wafer pedestal heaters with improved backside purging.

SUMMARY

One or more embodiments of the disclosure are directed to substrate supports comprising a plurality of bonded plates forming a single component support body. The single component support body has an outer peripheral edge, a top surface and a bottom surface defining a body thickness. A pocket is formed in the top surface of the support body. The pocket has a bottom surface, a depth and an outer peripheral edge. A purge ring is spaced a distance from the outer peripheral edge. The purge ring comprises at least one opening in the top surface in fluid communication with a purge gas line within the body thickness.

Additional embodiments of the disclosure are directed to substrate supports comprising a top plate and a bottom plate bonded to form a single component support body. The top plate has a top surface and a bottom surface. A purge ring is formed in the top surface with a plurality of openings extending through the top plate to the bottom surface. The bottom plate has a top surface and a bottom surface. The bottom plate has a channel formed in the top surface aligned with the plurality of openings extending through the top plate to the purge ring. The top surface of the bottom plate is bonded to the bottom surface of the top plate to form the single component support body.

Further embodiments of the disclosure are directed to methods of manufacturing a substrate support. A top plate having a top surface and a bottom surface is formed. A purge ring is formed in the top surface with a plurality of openings extending through the top plate to the bottom surface. A bottom plate having a top surface and a bottom surface is formed. The bottom plate has a channel formed in the top surface spaced a distance from an outer peripheral edge of the bottom plate to align with the plurality of openings extending through the top plate to the purge ring. The top surface of the bottom plate is bonded to the bottom surface of the top plate to form a single component support body.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure relate to pedestal heater designs to provide uniform temperature distributions on the wafer at multiple operating temperatures (e.g., 150° C.-550° C.).

Some embodiments provide pedestal heater architecture with a bipolar electrostatic chuck (ESC). Some embodiments advantageously provide integrated wafer backside gas capabilities and bevel purge capabilities. According to some embodiments, a bipolar ESC increases the backside purge flow capacity. Bipolar ESC of some embodiments allows higher bevel purge flow compared to other designs using a vacuum chuck.

Some embodiments provide a pedestal heater with multiple heating zones (e.g., three zones). In some embodiments, the multi-zone heater allows for local profile tuning on the heater center and edge.

Some embodiments provide a diffusion bonded edge ring. The diffusion bonded edge ring of some embodiments provides increased thermal uniformity and increased purge efficiency. In some embodiments, a diffusion bonded edge ring (ER) improves gap controls to improve bevel purge efficiency.

Figure 1:
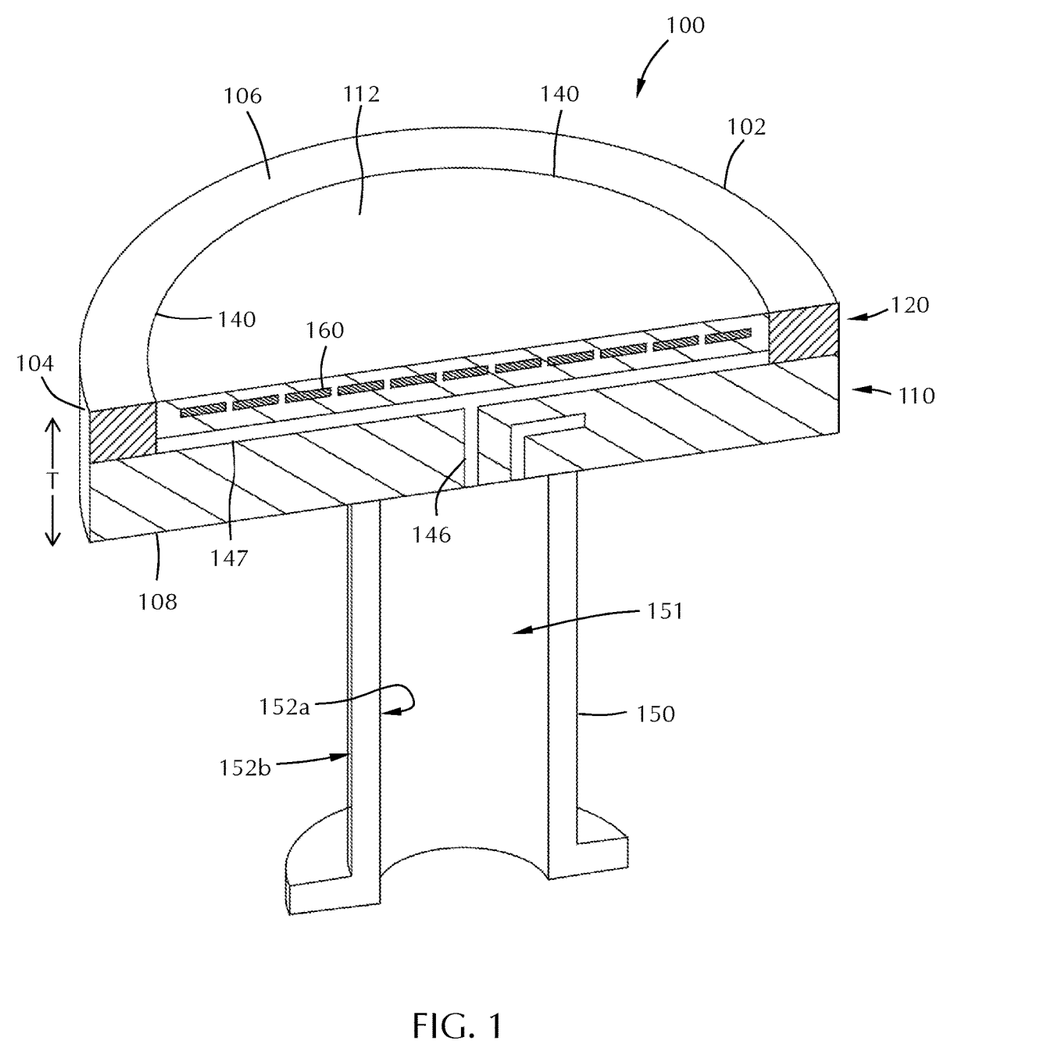
FIG. 1 illustrates a cross-sectional view of the substrate support according to one or more embodiment of the disclosure.

Referring to FIG. 1, one or more embodiments of the disclosure are directed to substrate supports 100 comprising a plurality of bonded plates 110, 120 formed into a single component body 102. The component body 102 has an outer peripheral edge 104, a top surface 106 and a bottom surface 108 defining a thickness T of the body 102.

Figure 2:
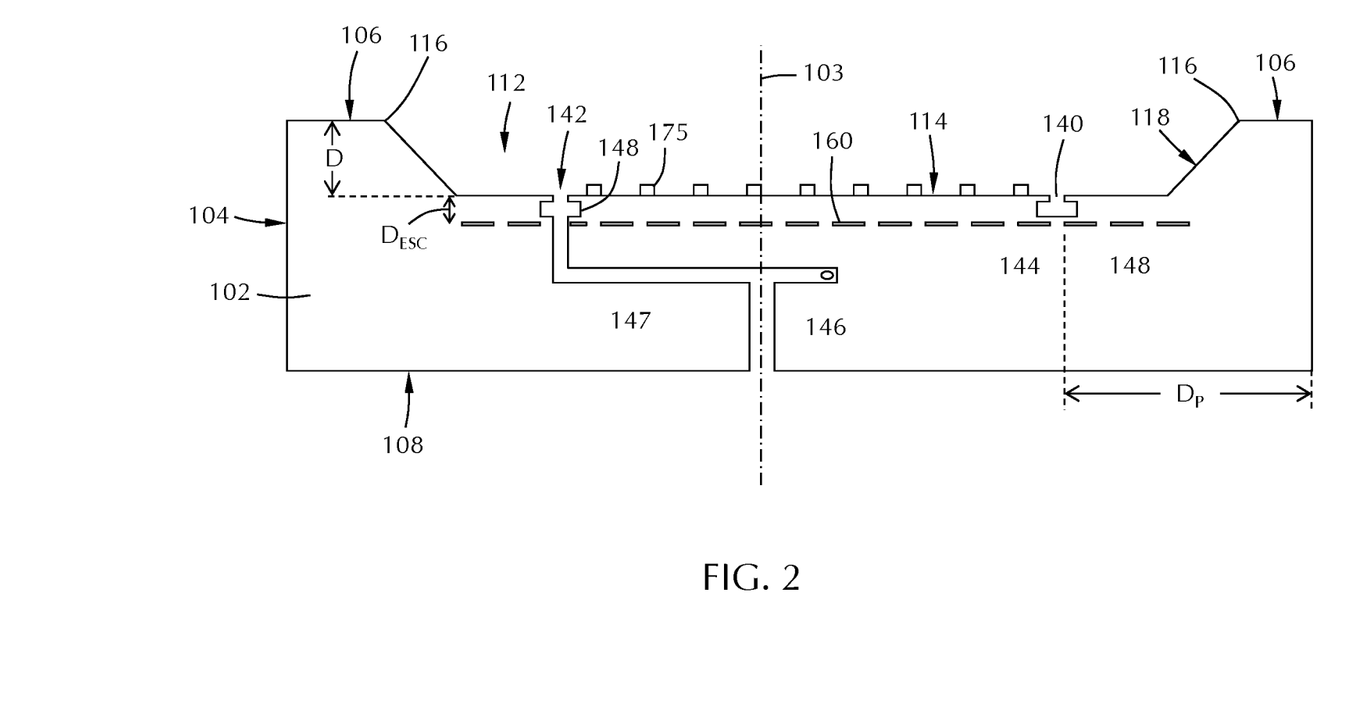
FIG. 2 illustrates a cross-sectional view of the substrate support according to one or more embodiment of the disclosure.

FIG. 2 shows a partial cross-sectional view of a single component body 102 substrate support 100 according to one or more embodiment of the disclosure. A pocket 112 is formed in the top surface 106 of the support body 102. The pocket 112 has a bottom surface 114, a depth D and an outer peripheral edge 116. In the embodiment illustrated in FIG. 2, the outer portion of the pocket 112 has a sloped face 118 transitioning from the bottom surface 114 to the outer peripheral edge 116. The outer peripheral edge 116 of the pocket 112 is located a distance DE from the outer peripheral edge 104 of the body 102.

A purge ring 140 is spaced a distance $D_P$ from the outer peripheral edge 116 of the pocket 112. The distance $D_P$ is measured to the outermost edge of the purge ring 140. In some embodiments, the purge ring 140 is spaced a distance from the outer peripheral edge 104 of the body 102. The purge ring comprises at least one opening 142 in the bottom surface 114 of the pocket 112. In the illustrated embodiment, the purge ring 140 comprises a single opening 142 in the bottom surface 114 of the pocket 112 that extends around a central axis 103 of the body 102. In some embodiments, a plurality of apertures (not shown) are formed in a bottom surface 144 of the opening 142

The bottom surface 114 of the pocket 112 is a portion of or extension of the top surface 106 of the body 102. The purge ring 140 of some embodiments comprises at least one opening 142 in the top surface 106 of the body 102. The opening 142 of the purge ring 140 is in fluid communication with a purge gas line 146 within the thickness T of the body 102. In some embodiments, as shown in FIG. 2, the purge gas line 146 is in fluid communication with a recursive gas line 147 within the body 102, the recursive gas line 147 is in fluid communication with a plenum 148 which is in fluid communication with the opening 142.

Referring back to FIG. 1, in some embodiments, a hollow shaft 150 is connected to the bottom surface 108 of the support body 102. The hollow shaft 150 has sidewalls 152 with a thickness defined between the inside surface 152a and the outside surface 152b. In some embodiments, the shaft 150 is configured to support the body 102 and contain additional components (e.g., power lines, purge gas) within the hollow region 151.

Figure 3:
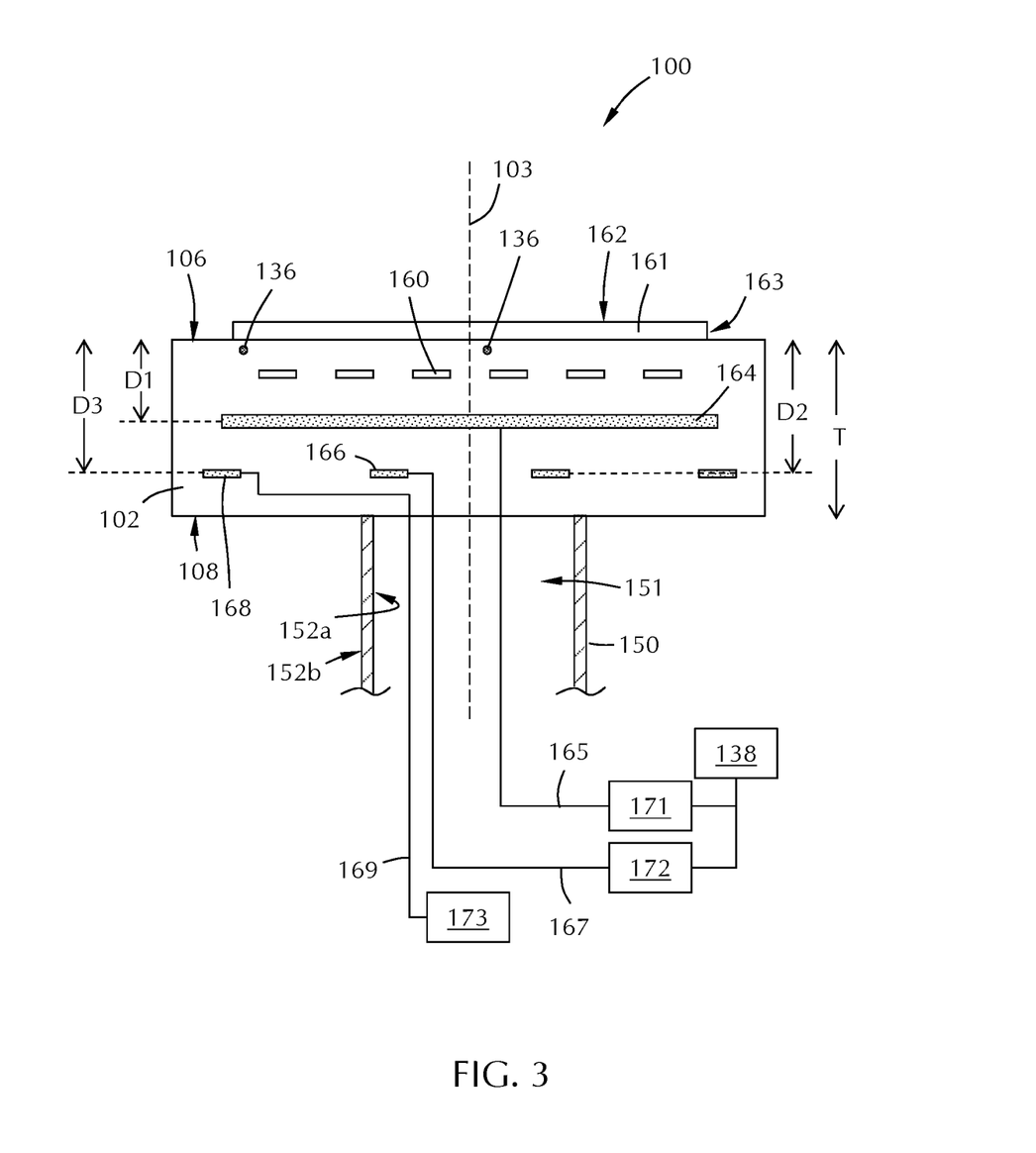
FIG. 3 illustrates a cross-sectional view of the substrate support according to one or more embodiment of the disclosure.

As shown in FIG. 3, in some embodiments, the substrate support 100 is configured as an electrostatic chuck. In some embodiments, one or more electrodes 160 are within the body 102 thickness and are configured to form an electrostatic chuck. In some embodiments, the one or more electrodes 160 are located at an electrode depth $D_{ESC}$ from the top surface 106 of the body 102. In some embodiments, the one or more electrodes 160 are configured as a monopolar electrostatic chuck. In some embodiments, the one or more electrodes 160 are configured as a bipolar electrostatic chuck. The one or more electrodes 160 can be connected to one or more power supplies (not shown) to polarize the electrodes to act as an electrostatic chuck.

In some embodiments, the substrate support 100 includes one or more heating elements. The body 102 of some embodiments includes a plurality of heating elements to more uniformly heat a substrate 161. A substrate 161 with a top surface 162 and an outer peripheral edge 163 is shown in FIG. 3. The embodiment illustrated in FIG. 3 has three heating elements; a primary heating element 164, an inner zone heating element 166 and an outer zone heating element 168. The skilled artisan will recognize that there can be any suitable number of heating elements and the scope of the disclosure is not limited to the three elements described.

The primary heating element 164 of some embodiments is positioned at a first depth D1 (also referred to as a primary heating element depth) below the top surface 106. For consistency, depth measurements recited herein are relative to the top surface 106 of the body. However, the skilled artisan will recognize that the recited depths can be measured from the bottom surface 114 of the pocket 112 and the difference between measurements is equal to the distance between the top surface 106 and the bottom surface 114.

In some embodiments, the first depth D1 is greater than or equal to about 50% of the thickness T of the body 102. In some embodiments, the first depth D1 is greater than or equal to about 55%, 60%, 65%, 70%, 75% or 80% of the thickness T of the body 102. In some embodiments, the body 102 has a thickness T in the range of about 10 mm to about 30 mm, or in the range of about 15 mm to about 25 mm or about 20 mm.

The embodiment shown in FIG. 3 includes an inner zone heating element 166 located within the body 102 at a second depth D2 from the top surface 106. In some embodiments, the second depth D2 is different than the first depth D1; either greater than or less than D1. The second depth D2 of some embodiments is greater than the first depth D1 so that the inner zone heating element 166 is closer to the bottom surface 108 of the body 102. In some embodiments, the second depth D2 is less than the first depth D1 sot that the inner zone heating element 166 is closer to the top surface 106.

In some embodiments, the inner zone heating element 166 is positioned within the body 102 over the sidewall 152 of the shaft 150. In some embodiments, the inner zone heating element 166 is centered over the sidewall 152 of the shaft 150. The skilled artisan will recognize that the inner zone heating element 166 is not limited to the illustrated location. In some embodiments, the inner zone heating element 166 is positioned to align with the center of the top plate. As used in this manner, the center of the top plate refers to the central axis and/or region around the central axis extending up to about 50% of the radius of the top surface 106 measured from the central axis 103. In some embodiments, the inner zone heating element 166 is positioned aligned with one or more high heat loss regions at or near the central axis 103. In some embodiments, the high heat loss regions are regions (e.g., having an outer diameter greater than the inner diameter by an amount in the range of 5 to 25 mm) where the heat flux exceeds the heat flux of the surrounding region (e.g., the region having an inner diameter beginning at the outer diameter of the subject region) by a predetermined percentage based on process requirements. In some embodiments, the predetermined percentage is in the range of 110% to 300%.

The body 102 of some embodiments has an outer zone heating element 168 at a third depth D3 from the top surface 106. The third depth D3 of some embodiments is greater than the first depth D1. In some embodiments, the third depth D3 is different than the first depth D1 and/or the second depth D2. In some embodiments, the third depth D3 is about the same as the second depth D2. As used in this manner, the term "about the same depth" means that the depth of the respective zones is within ±10%, ±5%, ±2% or ±1% relative to the average depth. As used herein, the term "different" when describing the depths D1, D2 and/or D3 means up to ±10%, ±5%, ±2% or ±1%. In some embodiments, the outer zone heating element 168 extends further from a central axis 103 of the substrate support 100 than the primary heating element 164. In some embodiments, the outer end of the outer zone heating element 168 is further from the central axis 103 than the outer end of the primary heating element 164. In some embodiments, the inner end of the outer zone heating element 168 is closer to the central axis 103 than the outer peripheral edge 163 of a substrate 161 to be processed.

The embodiments illustrated have three heating elements 164, 166, 168. The skilled artisan will recognize that more or less heating elements can be incorporated into the body 102. In some embodiments, there are two heating elements, the primary heating element 164 and inner zone heating element 166. In some embodiments, there are two heating elements, the primary heating element 164 and outer zone heating element 168. In some embodiments, there are four or more heating elements, the primary heating element 164, inner zone heating element 166, outer zone heating element 168 and one or more intermediate zone heating elements (not shown). The intermediate zone heating elements of some embodiments have a different depth than the inner zone heating element or outer zone heating element. In some embodiments, the intermediate zone heating elements have about the same depth as the inner zone heating element 166 and outer zone heating element 168.

In some embodiments, the shaft 150 of the substrate support 100 further comprises a primary heating element power line 165, an inner zone heating element power line 167 and an outer zone heating element power line 169 routed through the hollow shaft 151 to the body 102. In some embodiments, the inner zone heating element power line 167 powers both the inner zone heating element 166 and the outer zone heating element 168. In some embodiments, the inner zone heating element 166 and the outer zone heating element 168 are connected by a jumper wire (not shown). In the illustrated embodiment, power sources 171, 172, 173 are connected to the primary heating element power line 165, inner zone heating element power line 167 and outer zone heating element power line 169, respectively. The power sources 171, 172, 173 can be any suitable power sources known to the skilled artisan. In some embodiments, one power source provides power to more than one heating element.

Referring back to FIG. 2, some embodiments of the substrate support 100 have a plurality of mesas 175 formed on the top surface 106, or the bottom surface 114 of the pocket 112. In some embodiments, the mesas 175 are formed within the purge ring 140. The mesa height of some embodiments is tuned to provide increased thermal coupling between the wafer and heater. The top surface of the mesas 175 acts as the local support surface for the substrate 161. In some embodiments, the mesas 126 have a height (h) in the range of about 10 µm to about 40 µm, or in the range of about 12.5 µm to about 35 µm, or about 15 µm to about 30 µm.

In one or more embodiments, the body 102 of the substrate support 100 further comprises of one or more temperature sensors 136 within the body 102, as shown in FIG. 3. The temperature sensors 136 of some embodiments are used with a feedback circuit to control individual power settings to the primary heating element 164, inner zone heating element 166 or outer zone heating element 168, or additional heating elements (not shown).

Referring back to FIG. 2, one or more embodiments of the substrate support 100 include a controller 138 comprising one or more configurations selected from a configuration to power the primary heating element 114, a configuration to power the inner zone heating element 116, a configuration to power the outer zone heating element 118, a configuration to measure a temperature of the body 102, a configuration to power one or more electrodes 128 within the body 102 to electrostatically chuck a substrate 120 to the support surface 104 and/or a configuration to control a vacuum source or purge gas source connected to and in fluid communication with the purge ring 140.

Figure 4:
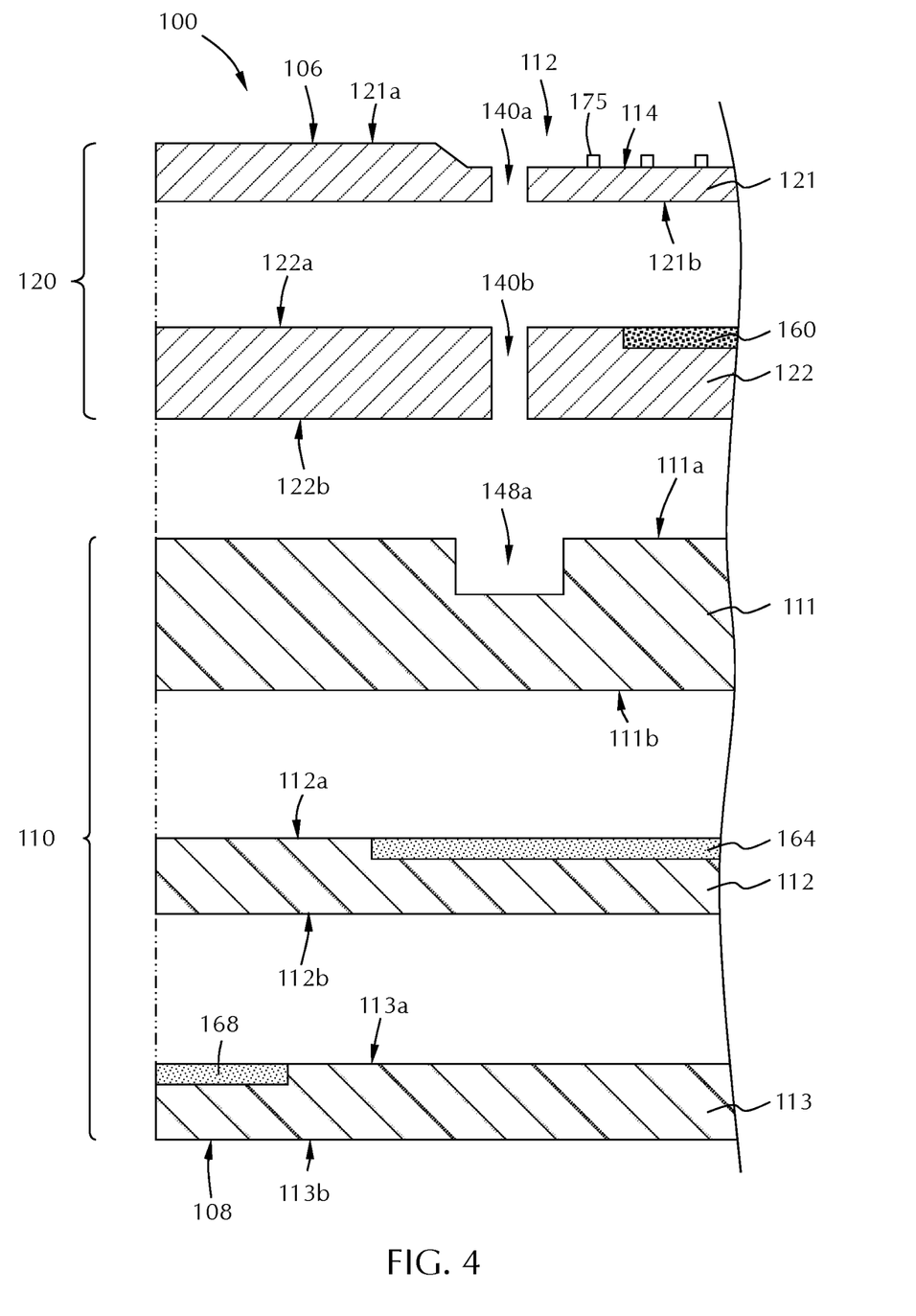
FIG. 4 illustrates an exploded partial cross-sectional view of the substrate support according one or more embodiment of the disclosure.
Figure 5:
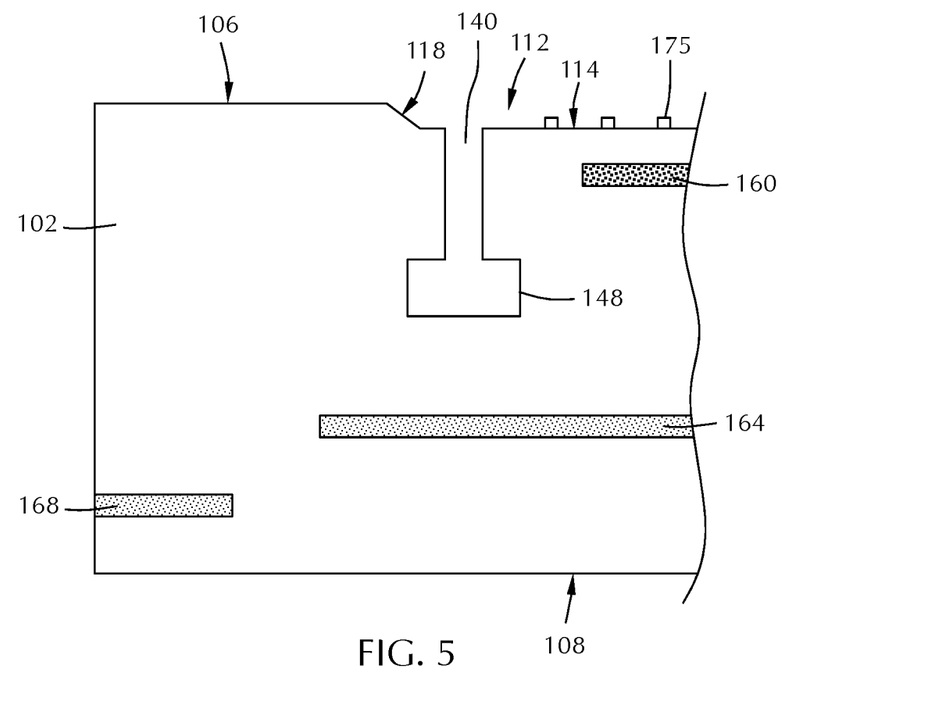
FIG. 5 illustrates a partial cross-sectional view of the substrate support of FIG. 4 after bonding according to another embodiment of the disclosure.

Referring to FIGS. 4 and 5, one or more embodiments of the disclosure are directed to substrate supports 100 comprising a top plate 120 and a bottom plate 110 bonded to form a single component support body 102. Some embodiments of the disclosure are directed to methods of forming substrate supports 100 made of multiple plates. FIG. 4 illustrates assembly of multiple plates to form the substrate support 100 in accordance with one or more embodiment of the disclosure. The shading used in FIG. 4 is for illustrative purposes to denote the top plate 120 components and the bottom plate 110 components. The shading does not imply any particular materials.

In some embodiments, the top plate 120 comprises a first top plate 121 and a second top plate 122. The first top plate 121 has a top surface 121a which will become the top surface 106 of the body 102 of the substrate support 100. The first top plate 121 has a bottom surface 121b and a pocket 112 formed in the top surface 121a. A purge ring 140a extends through the first top plate 121.

The second top plate 122 has a top surface 122a and a bottom surface 122b. The top surface 122a of the second top plate 122 of some embodiments is bonded to the bottom surface 121b of the first top plate 121 to form the top plate 120. The second top plate 122 of some embodiments has a plurality of openings 140b aligned with the purge ring 140a in the first top plate 121. The embodiment illustrated in FIG. 4 shows a portion of the second top plate 122 in which the opening 140b is shown. The skilled artisan will recognize that the second top plate 122 of this embodiment has a plurality of circularly arranged openings 140b and that in a cross-sectional view taken where no opening 140b occurs would appear as a solid component.

The second top plate 122 of some embodiment includes one or more electrodes 160 formed in the top surface 122a. When the second top plate 122 is bonded to the first top plate 121 to form a single component top plate 120, the electrodes 160 become enclosed within the body or sandwiched between the first top plate 121 and the second top plate 122. The second top plate 122 of some embodiments includes electrical connections for the electrodes.

The bottom plate 110 of some embodiments, as illustrated in FIG. 4, has a top surface 110a and a bottom surface 110b. The bottom surface 110b becomes the bottom surface 108 of the body 102. The illustrated bottom plate 110 comprises three plates; a first bottom plate 111, a second bottom plate 112 and a third bottom plate 113.

The first bottom plate 111 has a top surface 110a and a bottom surface 111b. A channel 148a is formed in the top surface 110a of the first top plate 111. The channel 148 is aligned with the plurality of openings 140b in the second top plate 122 so that when the first bottom plate 111 is bonded to the second top plate 122 to form a single component support body, the channel 148a becomes plenum 148, as shown in FIG. 2.

In some embodiments, a second bottom plate 112 has a top surface 112a and a bottom surface 112b. A primary heating element 164 is formed in the top surface 112a of the second bottom plate 112 so that the primary heating element 164 is sandwiched between the bottom surface 111b of the first bottom plate 111 and the second bottom plate 112 to form a single component bottom plate.

In the embodiment illustrated in FIG. 4, the bottom plate 110 further comprises a third bottom plate 113 with a top surface 113a and a bottom surface 113b. The bottom surface 113b of the third bottom plate 113 becomes the bottom surface 108 of the body 102 when a single component plate is formed upon bonding. The third bottom plate 113 of some embodiments comprises one or more of an inner zone heating element (not shown in FIG. 4) or outer zone heating element 168 formed in the top surface 113a so that the heating element is sandwiched between the bottom surface 112b of the second bottom plate 112 and the third bottom plate 113 when a single component bottom plate 110 is formed.

In some embodiments, the top plate 120 is formed by bonding the first top late 121 and the second top plate 122, and the bottom plate 110 is formed by bonding the first bottom plate 111 and second bottom plate 112, and optionally a third bottom plate 113. Once each of the top plate and bottom plate are formed, the top plate can be bonded to the bottom plate to form the single component substrate support body 102. In some embodiments, bonding of any of the plates to adjacent plates occurs at elevated temperatures to fuse the plates into a single component.

Figure 6:
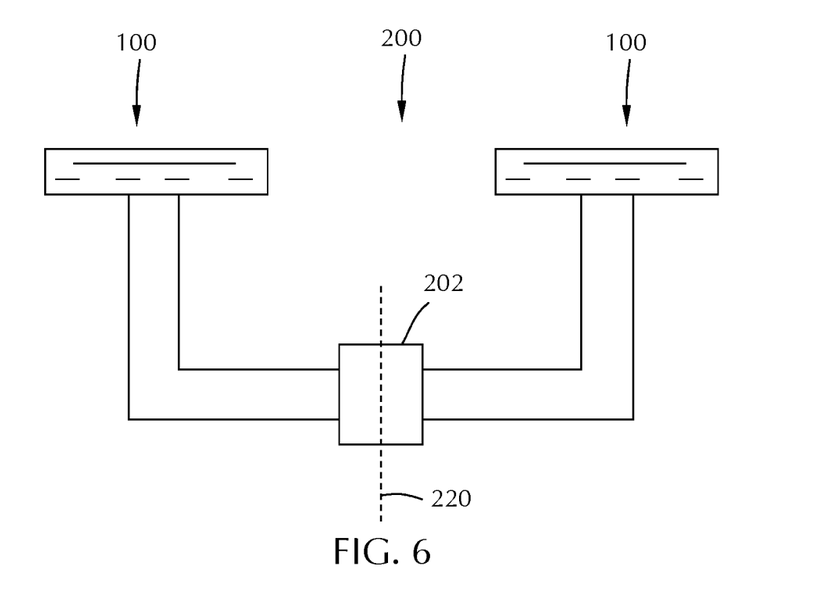
FIG. 6 illustrates a schematic view of a substrate support assembly with a plurality of substrate supports according to one or more embodiment of the disclosure.

Referring to FIG. 6, some embodiments of the disclosure are directed to substrate support assemblies 200. The substrate support assembly 200 comprises a plurality of substrate supports 100 connected to a central hub 202. The embodiment illustrated in FIG. 6 shows two substrate supports 100 connected to the central hub 202. In some embodiments, there are three, four, five or six substrate supports 100 connected to the central hub 202. The substrate supports 100 of some embodiments are equally spaced around the periphery of the central hub 202 to create a rotationally symmetric assembly 200.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A substrate support comprising:
    a plurality of bonded plates forming a single component support body having an outer peripheral edge, a top surface and a bottom surface defining a body thickness;
    a pocket formed in the top surface of the support body, the pocket having a bottom surface, a depth and an outer peripheral edge; and
    a purge ring spaced a distance from the outer peripheral edge, the purge ring comprising at least one opening in the top surface in fluid communication with a purge gas line within the body thickness.

2. The substrate support of claim 1, further comprising a hollow shaft connected to the bottom surface of the support body.

3. The substrate support of claim 2, further comprising one or more electrodes within the body thickness at an electrode depth from the top surface configured to form an electrostatic chuck.

4. The substrate support of claim 2, further comprising a primary heating element within the body thickness at a first depth below the top surface.

5. The substrate support of claim 4, further comprising an inner zone heating element within the body thickness at a second depth different from the first depth, and an outer zone heating element within the body thickness at a third depth from the top surface different than the first depth.

6. The substrate support of claim 5, further comprising a primary heating element power line, an inner zone heating element power line and an outer zone heating element power line routed through the hollow shaft to the top plate.

7. The substrate support of claim 1, further comprising a plurality of mesas formed on the top surface within the purge ring.

8. The substrate support of claim 7, wherein the mesas have a height in the range of about 10 μm to about 40 μm.

9. The substrate support of claim 1, further comprising one or more temperature sensors within the body thickness.

10. A substrate support comprising:
a top plate having a top surface and a bottom surface, a purge ring formed in the top surface with a plurality of openings extending through the top plate to the bottom surface; and
a bottom plate having a top surface and a bottom surface, the bottom plate having a channel formed in the top surface aligned with the plurality of openings extending through the top plate to the purge ring, the top surface of the bottom plate bonded to the bottom surface of the top plate to form a single component support body, wherein the top plate comprises a first top plate having the purge ring extending through the first top plate and a second top plate having a plurality of openings extending through the second top plate, the plurality of openings aligned with the purge ring in the first top plate, the first top plate and second top plate bonded to form a single component top plate.

11. The substrate support of claim 10, wherein the second top plate has at least one electrode formed in a top surface of the second top plate so that the at least one electrode is sandwiched between the first top plate and the second top plate.

12. The substrate support of claim 10, wherein the bottom plate comprises a first bottom plate having the channel formed in the top surface, and a second bottom plate having a primary heating element formed in a top surface of the second bottom plate so that the primary heating element is sandwiched between the first bottom plate and the second bottom plate to form a single component bottom plate.

13. The substrate support of claim 12, wherein the bottom plate further comprises a third bottom plate having an outer zone heating element formed in a top surface of the third bottom plate, the third bottom plate bonded to a bottom surface of the second bottom plate so that the outer zone heating element is sandwiched between the third bottom plate and the second bottom plate to form a single component bottom plate.

14. The substrate support of claim 13, wherein the top plate and the bottom plate are bonded by elevated temperatures to fuse the plates.

15. A method of manufacturing a substrate support, the method comprising:
forming a top plate having a top surface and a bottom surface, a purge ring formed in the top surface with a plurality of openings extending through the top plate to the bottom surface;
forming a bottom plate having a top surface and a bottom surface, the bottom plate having a channel formed in the top surface spaced a distance from an outer peripheral edge of the bottom plate to align with the plurality of openings extending through the top plate to the purge ring; and
bonding the top surface of the bottom plate to the bottom surface of the top plate to form a single component support body, wherein forming the top plate comprises bonding a first top plate to a second top plate to form a single component, the first top plate having the purge ring extending through the first top plate and a second top plate having a plurality of openings extending through the second top plate, the plurality of openings aligned with the purge ring in the first top plate, the first top plate and second top plate.

16. The method of claim 15, wherein the second top plate has at least one electrode formed in a top surface of the second top plate so that the at least one electrode is sandwiched between the first top plate and the second top plate.

17. The method of claim 16, wherein forming the bottom plate comprises bonding a first bottom plate to a second bottom plate to form a single component, the first bottom plate having the channel formed in the top surface, and the second bottom plate having a primary heating element formed in a top surface of the second bottom plate so that the primary heating element is sandwiched between the first bottom plate and the second bottom plate.

18. The method of claim 17, wherein forming the bottom plate further comprises bonding a third bottom plate to the second bottom plate to form a single component, the third bottom plate having an outer zone heating element formed in a top surface of the third bottom plate, the third bottom plate bonded to a bottom surface of the second bottom plate so that the outer zone heating element is sandwiched between the third bottom plate and the second bottom plate.

* * * * *